United States Patent [19]

Bader

[11] 4,306,191

[45] Dec. 15, 1981

[54] INITIALIZING CIRCUIT FOR LONG-TIME CONSTANT ELECTRONIC DEVICES

[75] Inventor: Clifford J. Bader, West Chester, Pa.

[73] Assignee: Burroughs Corporation, Detroit, Mich.

[21] Appl. No.: 99,868

[22] Filed: Dec. 3, 1979

[51] Int. Cl.³ .......................... G06G 7/18; H03K 5/22

[52] U.S. Cl. .................................... 328/127; 307/494; 307/571

[58] Field of Search ................ 328/127, 128; 307/229, 307/230, 494, 571; 364/733, 829

[56] References Cited

U.S. PATENT DOCUMENTS

| | | | |
|---|---|---|---|
| 3,660,769 | 5/1972 | Jordan et al. | 328/127 |
| 3,764,831 | 10/1973 | Zwitter et al. | 328/127 |
| 4,211,981 | 7/1980 | Lorma | 328/127 |

*Primary Examiner*—Stanley D. Miller, Jr.
*Assistant Examiner*—B. P. Davis
*Attorney, Agent, or Firm*—Francis A. Varallo; David G. Rasmussen; Edmund M. Chung

[57] ABSTRACT

An electronic circuit is described for accurately and rapidly initializing long-time constant amplifiers and the like. More specifically, the circuit is designed to establish quiescent conditions in minimal time and with minimal settling in amplifiers or integrators with internal or external voltage offsets. In performing its initializing function, the circuit utilizes a relatively low resistance network which mirrors the resistive network of the amplifier device and provides a charging path for the integrating capacitor. At the same time, the output of the device is permitted to immediately attain its steady-state voltage amplitude. The present auxiliary network automatically compensates for input offset error, so that quiescent conditions may be established extremely rapidly. Finally, the initialization configuration taught by the invention is characterized by simplicity and a small increase in the component count.

6 Claims, 6 Drawing Figures

INITIALIZING CIRCUIT FOR LONG-TIME CONSTANT ELECTRONIC DEVICES

BACKGROUND OF THE INVENTION

Operational amplifiers with long-time constant feedback networks are useful for many purposes. One application of these devices is that of amplifying and integrating the signal from a rate-dependent transducer, such as a search coil or magnetic vibration pickup, in order to obtain an output which is proportional to the driving function rather than to its time derivative. In some such applications, it is necessary that the signal response of the device extend to very low frequencies. Furthermore, in order to minimize phase shift, the feedback network cutoff frequency must occur approximately one decade lower than the frequency of the slowest signal. Thus, for response to 0.1 Hz, the network should cut off at 0.01 Hz. This corresponds to a time constant of about 16 seconds.

Since the output of the transducer at low frequencies is likely to be very small, for example, on the order of a few microvolts, it is necessary for the feedback network voltage, that is, the integrating capacitor charge, to be very nearly at its steady-state value before useful information can be obtained. If the state of charge is altered by a large amount, such as 1 volt, the settling time will be very long, possibly extending to hundreds of seconds. Such a disturbance may occur due to the turn-on of circuit power, or to the application of a large, fast input signal to the amplifier. In either event, the resultant waiting time is at best inconvenient and in some applications, prohibitive. It is therefore desirable, if not mandatory, that circuit means be incorporated for rapidly establishing steady-state conditions, that is, to initialize the system. The present invention fills this need in a versatile and efficient manner, not only permitting the amplifier output to go immediately to its steady-state voltage but automatically compensating for input offset error. Thus, quiescent conditions may typically be established within a fraction of a millivolt in integrating amplifiers. Moreover, for amplifiers with time constants of several seconds, the initialization provided by the circuit configuration of the present invention takes place in a time period of the order of tens of milliseconds.

SUMMARY OF THE INVENTION

In accordance with the present invention, there is provided a circuit configuration which includes an auxiliary resistive network which mirrors the resistances in the operational amplifier circuit and is of lower resistance relative to the latter resistances. Switch means are provided to couple the amplifier to the auxiliary network for initialization.

The auxiliary network is comprised of a pair of resistors having impedance values in the same ratio as those of the respective series connected feedback and input resistors normally associated with operational amplifiers. Thus, an input terminal of the amplifier is connected to the junction of the last mentioned resistors. An extremity of the input resistor is coupled to a source of input signals, while that of the feedback resistor is coupled to the amplifier output terminal. Where it is desirable to amplify and integrate the signal applied to the amplifier, an integrating capacitor is coupled between the junction of the input and feedback resistors, that is, the aforementioned amplifier input terminal, and the amplifier output terminal.

In accordance with the invention, whenever initialization is required, the capacitor input terminal coupled to the amplifier input is disconnected therefrom, and is coupled instead to the junction of the relatively lower impedance auxiliary network resistors, providing a shorter time constant charging path. One extremity of the auxiliary network resistors is coupled to a reference potential, while the other extremity is coupled to the amplifier output. In effect, the voltage at the junction of the auxiliary network resistors is equal to that at the junction of the input and feedback resistors, that is, the amplifier input. The integrating capacitor thus is charged to precisely the proper voltage, including automatic compensation for input offset errors associated with the amplifier operation, and no disturbance in the output voltage results when initialization is terminated and integrator operation resumed.

The foregoing circuit operation is accomplished with efficiency and hardware simplicity. Other features and advantages of the present invention will become apparent in the detailed description which follows.

DESCRIPTION OF THE PREFERRED EMBODIMENT

Figure 1:
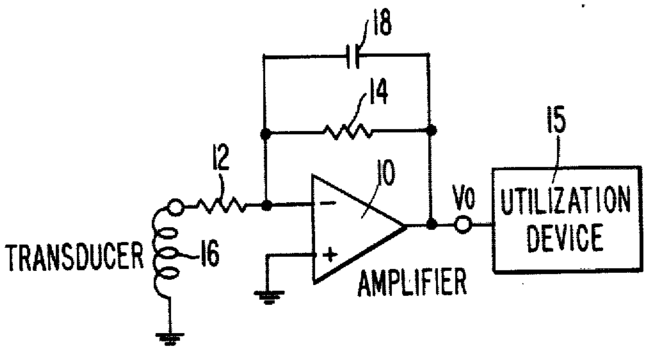
FIG. 1 is a schematic diagram of a typical integrator amplifier with a long-time constant.
Figure 2:
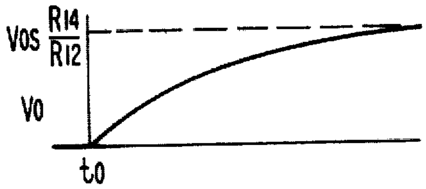
FIG. 2 depicts the output waveform of the amplifier of FIG. 1.
Figure 3:
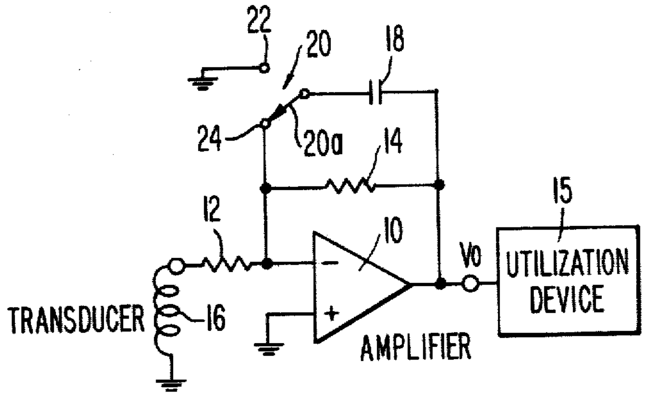
FIG. 3 is a circuit schematic illustrating a current method of initializing the circuit of FIG. 1.

Before proceeding with a description of the circuit embodiment of the invention as illustrated in FIG. 3, it is believed helpful to consider the basic integrator amplifier circuit of FIG. 1, along with present day means for the initialization thereof, as exemplified by the circuit of FIG. 3. Like reference characters are utilized to identify similar components throughout FIGS. 1-6.

In FIG. 1, an operational amplifier 10 is depicted having a positive and a negative input terminal and an output terminal. A series resistive network comprised of input resistor 12 and feedback resistor 14 has its common junction coupled to the negative input terminal of the amplifier 10. The positive input terminal of amplifier 10 is coupled to a reference potential, indicated as being ground. One end of input resistor 12 is coupled to a low impedance source of input signals, such as a search-coil pickup or transducer 16. Moreover, one end of feedback resistor 14 is coupled to the output terminal of amplifier 10. An integrating capacitor 18 has its pair of terminals connected respectively to the negative input terminal and the output terminal of the amplifier 10.

If the steady-state charge on capacitor 18 is zero, initialization of the circuit of FIG. 1 may be accomplished simply by short-circuiting capacitor 18 for a short period of time. However, in most cases the steady-state charge is not zero. An output voltage offset exists due to the operational amplifier input bias current flow through resistor 12 or to amplifier input offset voltage, or to a DC offset in the input signal. In this case, the short-circuiting of the integrating capacitor 18 is not feasible.

With continued reference to FIG. 1 and additional reference to the waveform of FIG. 2, a practical situation is depicted. Assuming that there is no signal input to amplifier 10 from transducer 16, an offset voltage $V_{os}$ will nevertheless be present on the negative input terminal of amplifier 10. The DC output voltage $V_o$ delivered to utilization device 15 will ultimately attain a level equal to $+V_{os}R_{14}/R_{12}$ for zero input signal. This is illustrated in FIG. 2. When amplifier 10 is turned on at time "$t_0$" with no input signal present, the amplifier output $V_o$ will settle to $V_{os}R_{14}/R_{12}$ with time constant $R_{14}\,C_{18}$. For an integrator with high $R_{14}$, low $R_{12}$ and large $C_{18}$, and with appreciable offset voltage $V_{os}$, this settling may interfere with input signal processing for an intolerably long interval.

Considerable improvement may be realized by the initialization provided by the circuit of FIG. 3. In the latter circuit for initialization, switching means are provided to disconnect the terminal of capacitor 18 from the negative input terminal of amplifier 10 and to connect it instead to ground or other predetermined reference potential. A simple mechanical single-pole, double-throw switch 20 represents the aforementioned switching means in the schematic of FIG. 3.

Figure 4:
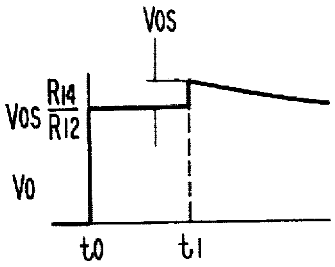
FIG. 4 depicts the output waveform of the amplifier of FIG. 3.

With additional reference to FIG. 4, in order to initialize at time "$t_0$", arm 20*a* of switch 20 is moved into contact with terminal 22 connected to ground potential. The amplifier output voltage $V_o$ immediately attains its quiescent or steady-state amplitude, namely $V_{os}$ $R_{14}/R_{12}$ and capacitor 18 is charged against the reference voltage (ground) to the output voltage. Since the amplifier output impedance is low, charging occurs rapidly, and the steady-state output voltage value is approached in a few milliseconds or tens of milliseconds. However, at time "$t_1$", when initialization is complete and the switch arm 20*a* is moved to terminal 24 to restore integrator operation, a difficulty is encountered in the circuit of FIG. 3. The capacitor 18 has been overcharged by an amount equal to $V_{os}$, the offset voltage appearing on the negative terminal of amplifier 10. That is, the circuit of FIG. 3 has failed to completely compensate for operational amplifier input offset error. Where very low input signals are being processed, the disturbance at time "$t_1$", and the settling time which follows cannot be tolerated. For example, in a practical application, if zero output voltage occurs with a 10 millivolt input differential, capacitor 18 will be charged to a voltage in error by that amount. When switch arm 20*a* is moved from terminal 22, the initialize position, to terminal 24 for normal integrator operation, the output voltage $V_o$ will shift by 10 millivolts and then settle to its final value with a time constant of $R_{14}\,C_{18}$.

If offset trimming is possible or if a 10 millivolt shift may be tolerated, the circuit of FIG. 3. may be used. However in high volume, low cost, compact equipment, such trimming may be impractical. The present invention, as depicted in FIG. 5, permits accurate initialization in the presence of input offset error and obviates the need for offset trimming.

Figure 5:
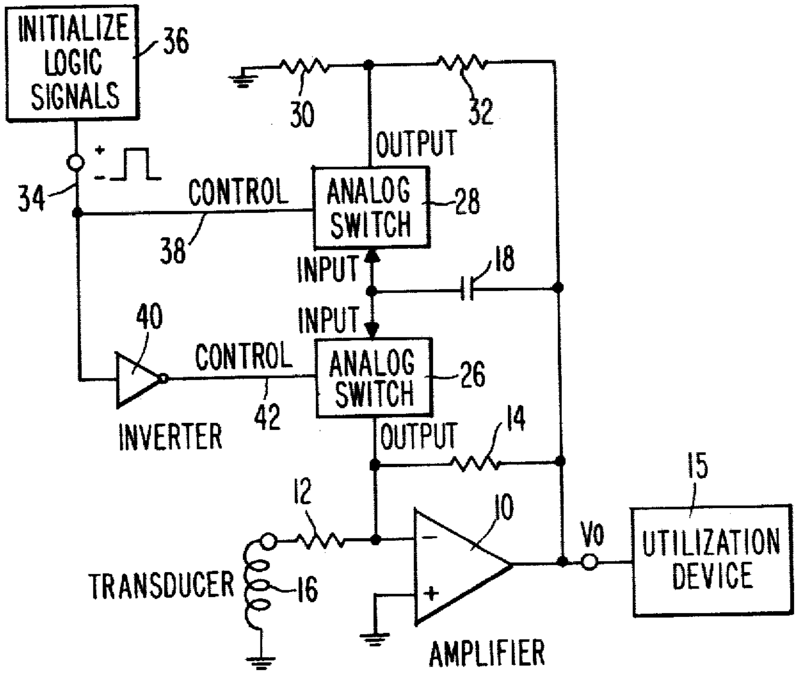
FIG. 5 illustrates the circuit configuration of the present invention for implementing the initialization of the amplifer of FIG. 1.

With reference to FIG. 5, switch means are provided as in FIG. 3. However the single-pole, double-throw switch function is advantageously provided by a pair of CMOS analog switches 26 and 28. Such switches are well known in the electronics art. A positive voltage appearing on the control line of such a switch will cause it to close with low impedance; conversely, a negative voltage on the control line will cause the associated switch to open. An auxiliary resistive network comprised of series connected resistors 30 and 32 is provided. One extremity of resistor 30 is connected to ground potential, while an extremity of resistor 32 is connected to the output terminal of amplifier 10. The auxiliary network is of lower resistance than the amplifier network $R_{12}\,R_{14}$, but its values are chosen such that $R_{32}/R_{30}=R_{14}/R_{12}$.

During normal integration operation, the potential on line 34 derived from the source 36 of the initialize logic signal is negative. Accordingly, control line 38 for switch 28 is negative causing switch 28 to be open and effectively removing the auxiliary network of resistors 30 and 32 from the circuit. By virtue of inverter 40, the control line 42 for switch 26 is positive and switch 26 is closed at this time.

Figure 6:
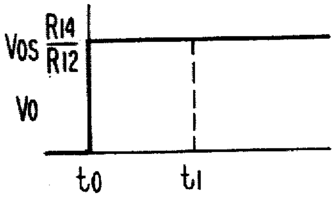
FIG. 6 is the output waveform resulting from the circuit of FIG. 5.

With additional reference to FIG. 6, at time "$t_0$" a positive initialize signal derived from source 36 appears on line 34. The effect of the initialize signal is to open switch 26 and to close switch 28, thereby disconnecting capacitor 18 from the negative input terminal of amplifier 10 and connecting it to the junction of the auxiliary network resistors 30 and 32.

The voltage at the junction of the last mentioned resistors is the same as that at the junction of resistors 12 and 14. The auxiliary network therefore provides a relatively low resistance charging path for the integrating capacitor, while allowing the amplifier output to go immediately to its steady-state voltage as seen in FIG. 6 The auxiliary network mirrors the series resistors 12 and 14 and automatically compensates for input-offset error so that quiescent conditions may be established to within a fraction of a millivolt in integrating amplifiers. The initialization time itself, utilizing the circuit of FIG. 5, is on the order of tens of milliseconds for amplifiers with time constants of several seconds. As is apparent in FIG. 6, the resumption of normal circuit operation at time "$t_1$", results in no disturbance of the amplifier output waveform.

It should be observed that certain errors due to resistor value tolerances and to bias current flow through resistor 14 are present in the circuit of FIG. 5. However, as will be considered in the following example of an actual operative embodiment of the circuit, such errors are of negligible proportion.

In one such embodiment, the values of the components in FIG. 5 are $R_{12}=50$ Kohms; $R_{14}=10$ megohms; $C_{18}=0.5$ microfarad; $R_{30}=1$ Kohms; and $R_{32}=200$ Kohms. Resistor 12 is assumed to include the DC source resistance of transducer 16. The amplifier 10 is one section of an "Intersil" 8023 operational amplifier, operated at 10 microamperes quiescent current. The input bias current is typically 10 nanoamperes and the offset voltage is ±5 millivolts. The open loop voltage gain is typically 100,000. Each of the analog switches is a section of RCA CD 4066. It must be emphasized that these and other circuit details found herein are presented solely for purposes of example to enable the reader to better appreciate the circuit operation. They are not to be construed as restricting the inventive concepts taught herein.

With 5 millivolts input offset, the steady-state output voltage would be very nearly equal to 1 volt. However, the 10 nanoampere bias current through resistor 14 develops 0.1 volt, which will be additive or subtractive depending on the offset voltage sense. Thus, the magnitude of the output voltage may be 0.9 or 1.1 volts.

The 0.1 volt drop is not generated in resistor 32. However due to the 1:200 auxiliary network ratio, the capacitor 18 will be charged in error by only approximately 0.5 millivolts. The represents a ten-fold improvement in the circuit performance despite the bias current error.

Resistor tolerances are likewise mitigated by the auxiliary network ratio. The percentage error applies against the 5 millivolt ideal value, and if resistors having a 1 percent tolerance are used in the circuit, the worst case error of 4 percent amounts only to 0.2 millivolts; and even this last value is statistically unlikely to occur.

In a practical application, the circuit of FIG. 5 has been used with a search coil pickup and provides an output of 0.1 volt/oersted to an analog-to-digital converter with a 1 millivolt threshold, that is 10 millioersteds/step. Frequency response extends to 0.1 Hz (18° phase shift). Turn-on initialization requires only a few milliseconds but is maintained for about 0.25 seconds to allow other associated circuits to settle. A threshold signal may be recognized immediately upon termination of initialization. The associated logic also generates an initialize sequence when an adnormally large signal is applied. Thus, the unit may be turned over in the earth's magnetic field, representing a 1 oersted step, and will immediately resume normal integration operation.

In summary, there has been described a practical circuit for initializing long-time constant devices. It should be understood that changes and modifications of the configuration described herein may be required to suit particular operating requirements. All such modifications and changes, insofar as they are not departures from the inventive teachings provided herein, are intended to be covered by the following claims.

What is claimed is:

1. An initializing circuit for a long-time constant electronic device comprising in combination:

amplifier means having a first and a second input terminal and an output terminal, a resistive network having a first and a second terminal at respective opposite extremities thereof and a third terminal disposed therebetween, said first terminal of said resistive network being adapted to receive input signals from a source thereof, said second and third terminal of said resistive network being connected respectively to said output terminal and said first input terminal of said amplifier means, said second input terminal of said amplifier means being connected to a reference potential, an integrating capacitor having a first and a second terminal, said first terminal of said integrating capacitor being coupled to said output terminal of said amplifier means.

an auxiliary resistive network of substantially similar configuration as said resistive network but having a relatively lower impedance with respect thereto, said auxiliary resistive network having a first and a second terminal at its opposite extremities and a third terminal disposed therebetween, said first and second terminal of said auxiliary resistive network being connected respectively to said reference potential and to said output terminal of said amplifier means, switching means connected to said second terminal of said integrating capacitor and being responsive to logic signals derived from a source thereof for selectively coupling said last mentioned terminal to said third terminal of said resistive network to permit normal integration operation of said electronic device, and to said third terminal of said auxiliary resistive network to provide a substantially faster charging path for said integrating capacitor than that provided by said resistive network, so as to achieve initialization of the operation of said electronic device.

2. An initializing circuit as defined in claim 1 further characterized in that said resistive network and said auxiliary resistive network each include first and second series connected resistors, said first and said second terminal of both said resistive network and said auxiliary resistive network corresponding to the respective extremities of said first and second resistors, said third terminal of both said resistive network and said auxiliary resistive network corresponding to the respective common junctions of said first and second resistors, the ratio of the resistance value of the second resistor to that of the first resistor in said auxiliary resistive network being substantially equal to the ratio of the resistance value of the second resistor to that of the first resistor in said resistive network.

3. An initializing circuit as defined in claim 2 further characterized in that said switching means includes first and second analog switches, each switch having an input terminal, an output terminal and a control terminal, the respective input terminals of said analog switches being connected in common to said second terminal of said integrating capacitor, the output terminals of said first and second analog switches being connected to the respective common junctions of said first and second series connected resistors of said resistive network and said auxiliary resistive network, logical inverter means coupling said control terminal of the first analog switch to said source of logic signals, said control terminal of the second analog switch being coupled to said last mentioned source, said logic signals causing one of said analog switches to be open and the other of said switches to be closed, at any given time.

4. An initializing circuit as defined in claim 3 further characterized in that said amplifier means is an operational amplifier having a negative and a positive input terminal corresponding respectively to said first and second input terminal of said amplifier means.

5. an initializing circuit as defined in claim 4 further characterized in that said source of input signals is a transducer.

6. An initializing circuit as defined in claim 5 further including an output utilization device coupled to the output terminal of said operational amplifier.

* * * * *